United States Patent [19]

Kontor et al.

[11] Patent Number: 5,041,788
[45] Date of Patent: Aug. 20, 1991

[54] SIMPLY SUPPORTED RING GEAR FOR AUTOTUNEABLE BODY RESONATOR

[75] Inventors: Kenneth C. Kontor, Chesterland; William H. Amor, Chagrin Falls; Kenneth J. Page, Mentor, all of Ohio

[73] Assignee: Picker International, Inc., Highland Hts., Ohio

[21] Appl. No.: 391,426

[22] Filed: Aug. 9, 1989

[51] Int. Cl.⁵ .............................................. G01R 33/20
[52] U.S. Cl. ...................... 324/318; 324/322
[58] Field of Search ............... 324/307, 313, 318, 322; 343/866, 867; 336/65, 69

[56] References Cited

U.S. PATENT DOCUMENTS 4,695,801  9/1987  Arakawa et al. .................... 324/322
4,736,161  4/1988  Prevot et al. ........................ 324/318
4,783,629  11/1988 Arakawa et al. .................... 324/322

Primary Examiner—Michael J. Tokar
Attorney, Agent, or Firm—Fay, Sharpe, Beall, Fagan, Minnich & McKee

[57] ABSTRACT

Main field magnets (10) create a static magnetic field through an examination region that is surrounding a resonator coil assembly (22). The resonator coil assembly includes a dielectric cylinder (60) on which a plurality of foil antenna or coil segments (30) are mounted. Pairs of adjustable tuning and matching capacitors (28, 34) are mounted on opposite sides of the cylinder in electric connection with the foil segments. The tuning capacitors are connected with a first pair of driven gears (90) disposed on one side of an annular reinforcing ring (64) and the matching capacitors are connected with a second pair of driven gears (100) mounted on the other side of the reinforcing ring. First and second ring gears (66, 68) are mounted at three points on opposite sides of the reinforcing ring each at its respective drive gear and pair of driven gears. In this manner, rotation of the appropriate drive gear rotates the respective ring gear about the cylinder causing concurrent rotation of the associated driven gears such that the associated pair of capacitors are adjusted concurrently by the same amount. Optionally, keeper assemblies (110) may be connected to the annular reinforcing ring to prevent circumferential deflection of the ring gears.

18 Claims, 4 Drawing Sheets

SIMPLY SUPPORTED RING GEAR FOR AUTOTUNEABLE BODY RESONATOR

BACKGROUND OF THE INVENTION

The present invention relates to ring gears, particularly as used for concurrent adjustment. The invention finds particular application in conjunction with tuning quadrature whole body resonator coils in magnetic resonance imaging apparatus and will be described with particular reference thereto. However, it is to be appreciated that the invention may find further application in transmitting adjustment inputs for tuning other magnetic resonance apparatus, for adjusting other diagnostic imaging apparatus, and the like.

Conventionally, magnetic resonance imagers include a whole body radio frequency resonator. The resonator is typically a plastic cylinder of sufficient diameter to receive inner bore lining constructions, patient couch drives, and the like while still providing sufficient diameter for the patient to be passed axially therethrough. Generally, the cylinder is 60 to 70 centimeters in diameter. Radio frequency coils are mounted on the plastic cylinder for transmitting 90°, 180° and other radio frequency pulses into a patient received in the resonator. The radio frequency coils also receive radio frequency magnetic resonance signals from the patient. The RF coils can be distributed windings but are more commonly laminated foil segments, particularly in a high field machine.

The resonance frequency of the resonator is determined in large part by the RF coil construction, particularly its inductance and capacitance. However, when a patient is introduced into the cylinder, the effective capacitance of the coil, hence its frequency, changes. To counteract the patient capacitance, adjustable tuning reactances, commonly capacitors, are mounted on the coil. By adjusting these tuning capacitances, the resonance frequency of the coil can be returned to a preselected resonance frequency. The resonator coil assembly includes symmetric foil, wire or other RF coil portions. A pair of impedance matching networks are installed between the coil portions and a ground liner. The impedance matching networks include first and second adjustable impedances, generally capacitances, which are connected directly with the coil segments. The two tuning capacitances are mounted 180° apart around the coil assembly and are mechanically interconnected to be adjusted concurrently. A pair of matching reactances, commonly capacitors are each connected between one of the tuning capacitors and ground. The matching capacitances are again mounted 180° apart and interconnected mechanically to be adjusted concurrently. The RF cables to the coil are connected at the junction between the matching and tuning capacitances.

Due to symmetry requirements, the RF coil and the adjustable tuning capacitors are commonly mounted symmetrically. That is, the tuning capacitors are generally disposed about 180° apart oppositely on the resonance coil. Because the two tuning capacitors must be changed by precisely the same amount during an adjustment, both are connected to a common drive. The common drive has heretofore taken the form of a drive shaft mounted parallel to the axis of the resonator coil but on the outside of its structure. Other drive shafts extended from the mounting point of the variable capacitors, about two thirds of the way down the resonator cylinder, toward the same end of the cylinder. A series of toothed belts were provided for transmitting rotational input to the drive shafts of both capacitors.

In order for the toothed belts to convey the movement around about 90° of the outside of the cylinder from the drive shaft to the capacitor shafts without rubbing on it, a plurality of toothed belts were provided. A first toothed belt extended from the drive shaft a fraction of the way around a cylinder where a gear assembly transferred the motion from the first toothed belt to a second. Additional gear assemblies and tooth belts were provided until the toothed belts extended from the drive shaft to both capacitor drive shafts. In addition to the gear assemblies at the ends of each belt, each belt also had an idle or tensioning arrangement along its length.

In a manually adjusted system, the matching and tuning capacitances are adjusted for each patient. In an automatically tuned system, the capacitances may be adjusted between each image for optimal performance.

During tuning, one of the capacitor pairs, e.g. the matching capacitors, are adjusted until the response is optimized. Then, the other capacitance pair, e.g. the tuning capacitances are adjusted until the response is optimized. Because the tuning and matching capacitances interact, the matching capacitances must be readjusted after the tuning capacitances have been varied. The matching and tuning capacitances are adjusted alternately until an overall optimal response is iteratively achieved.

The whole body resonator coil is mounted in the center of the magnetic resonance imager. Often, it is one of the first structures installed with numerous components of associated hardware being mounted around it. Replacing a broken belt in the matching and tuning capacitance adjusting arrangement normally required a full day to disassemble the scanner, replace the belt, recalibrate the scanner. With a manual adjustment system, such maintenance was commonly required every six to nine months. In a computer based autotune system, the computer'speed enables the number of adjustments and adjustment iterations to be increased to such an extent that expected belt life is reduced to the order of days or weeks. The full day down time to service the belts this frequently is considered unacceptable by most purchasers.

In accordance with the present invention, a new and improved capacitor adjustment system is provided which overcomes the above referenced failure problems and others.

SUMMARY OF THE INVENTION

In accordance with one aspect of the present invention, a resonance coil assembly is provided. Radio frequency antenna segments are mounted to a dielectric cylinder which is sized to receive a subject along a central axis thereof. A first pair of adjustable reactances are mounted oppositely on the outside of the cylinder. Each variable reactance is connected with a driven gear for adjusting the reactance. A toothed dielectric ring gear e-tends peripherally around the dielectric cylinder engaging the driven gears and an input drive gear for rotating the ring.

In accordance with a more limited aspect of the present invention, the dielectric ring gear is mounted at only three points—at the input drive gear and the two driven gears.

In accordance with another more limited aspect of the present invention, both a pair of tuning and a pair of matching reactances are mounted to the dielectric cylinder. A second dielectric ring is connected with a second drive and driven gears associated with the other pair of variable reactances.

In accordance yet more limited aspect of the present invention, a magnetic resonance imaging device is provided. A magnetic field means generates a static and gradient magnetic fields through the resonator coil. An RF transmitter and receiver are provided for selectively exciting magnetic resonance of a region of a subject within the resonator coil assembly and for receiving magnetic resonance signals therefrom. At least the radio frequency transmitter is connected with the antenna segments on the resonator coil assembly. An image reconstruction means reconstructs the magnetic resonance signals received by the radio frequency receiver into an image representation.

One advantage of the present invention resides in its freedom from maintenance. The replacement of broken belts is eliminated and a projected life of several years is achieved.

Another advantage of the present invention is that even routine maintenance, such as lubrication, is unnecessary.

Yet another advantage of the present invention resides in its simplicity. The assembly has many fewer parts than the prior art belt drives. Moreover, initial assembly and calibration is simplified.

Still further advantages of the present invention will become apparent to those of ordinary skill in the art upon reading and understanding the following detailed description.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
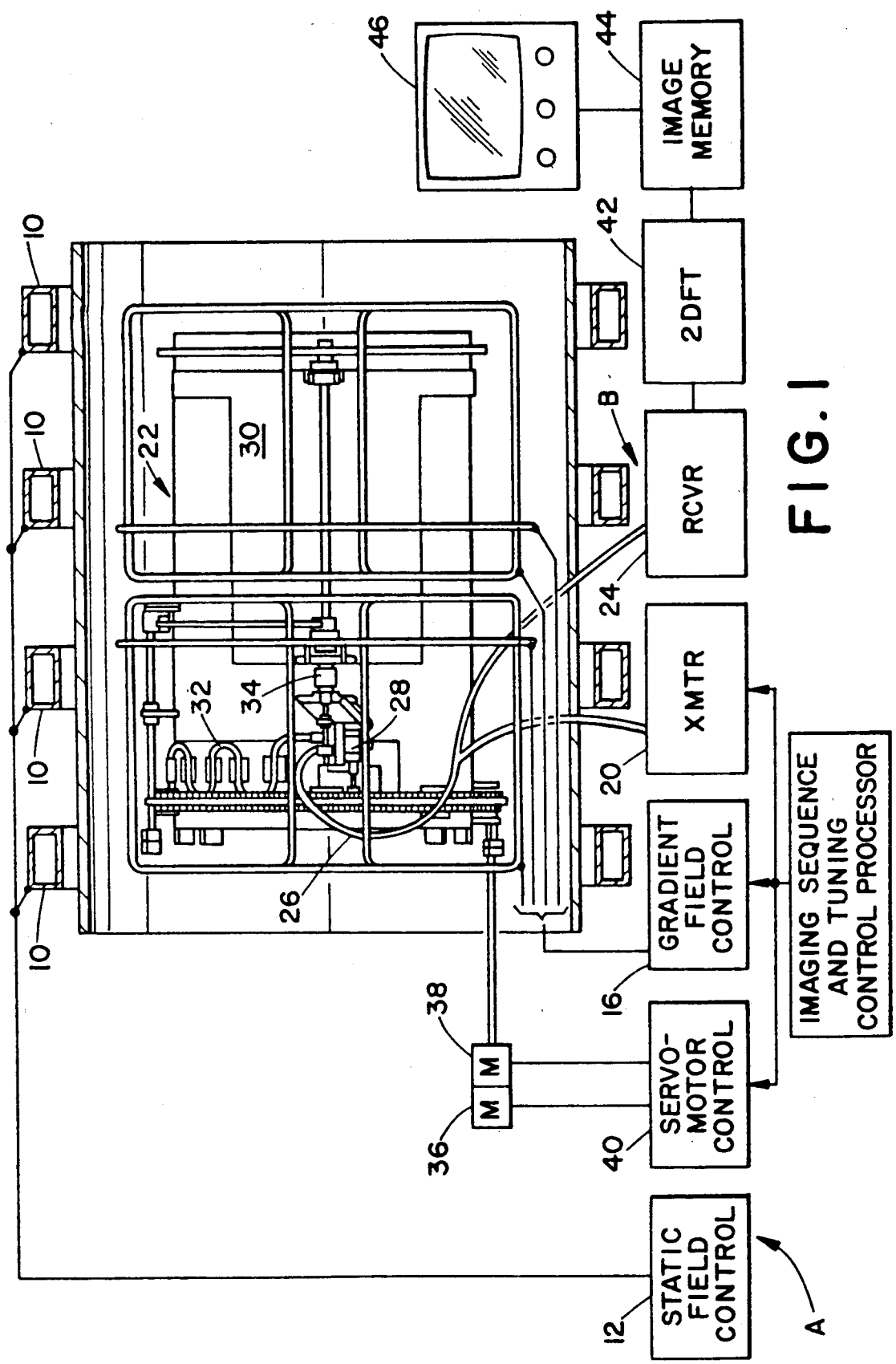
FIG. 1 is a diagrammatic illustration of a magnetic resonance imaging apparatus in accordance with the present invention.

With reference to FIG. 1, magnetic field means A selectively generates selected magnetic field patterns. A plurality of resistive or super conducting magnets 10 are operated by a static magnetic field control means 12 to generate a generally uniform- static magnetic field therethrough. An array of gradient coils 14 are operated under the control of a gradient magnetic field control means 16 to create magnetic field gradients across the static magnetic field. Preferably, the magnetic field gradients are selectively created along one or more of three orthogonal axes.

A radio frequency means B selectively excites resonance of selected dipoles within the subject and receives resonance signals emanating from the subject. A radio frequency transmitter 20 generates 90°, 180°, and other preselected radio frequency pulses for exciting and manipulating magnetic resonance in the subject. The radio frequency pulses are conveyed to a whole body resonator coil assembly 22 that has a hollow bore therethrough dimensioned for selectively receiving the subject. A radio frequency receiver 24 receives magnetic resonance signals picked up by the whole body resonator coil assembly 22. More specifically, a cable 26 for the radio frequency transmitter and receiver is connected to a first adjustable tuning impedance 28, preferably, an adjustable capacitance connected with a foil antenna or coil segment 30. A balun cable, such as a half wave length coaxial cable 32 connects the radio frequency cable with a 180° oppositely mounted, second tuning capacitor and antenna segment. Additional antenna segments may be mounted inside the cylinder 90° rotated from the first pair for quadrature detection. A pair of adjustable matching reactances, preferably capacitors including adjustable capacitor 34 interconnect the tuning capacitors and the RF or balun cable connection with ground.

A pair of servo motors 36, 38 under the control of a servo motor control means 40 selectively adjust the tuning and matching capacitor pairs to tune the resonance frequency and match the impedance for each subject.

An image reconstruction means 42, such as a means which performs a two dimensional Fourier transform algorithm reconstructs an image representation from the received resonance signals. The image representation is stored in an image memory 44 to facilitate display on a video monitor 46, further processing, archiving on tape or disk, or the like.

Figure 2:
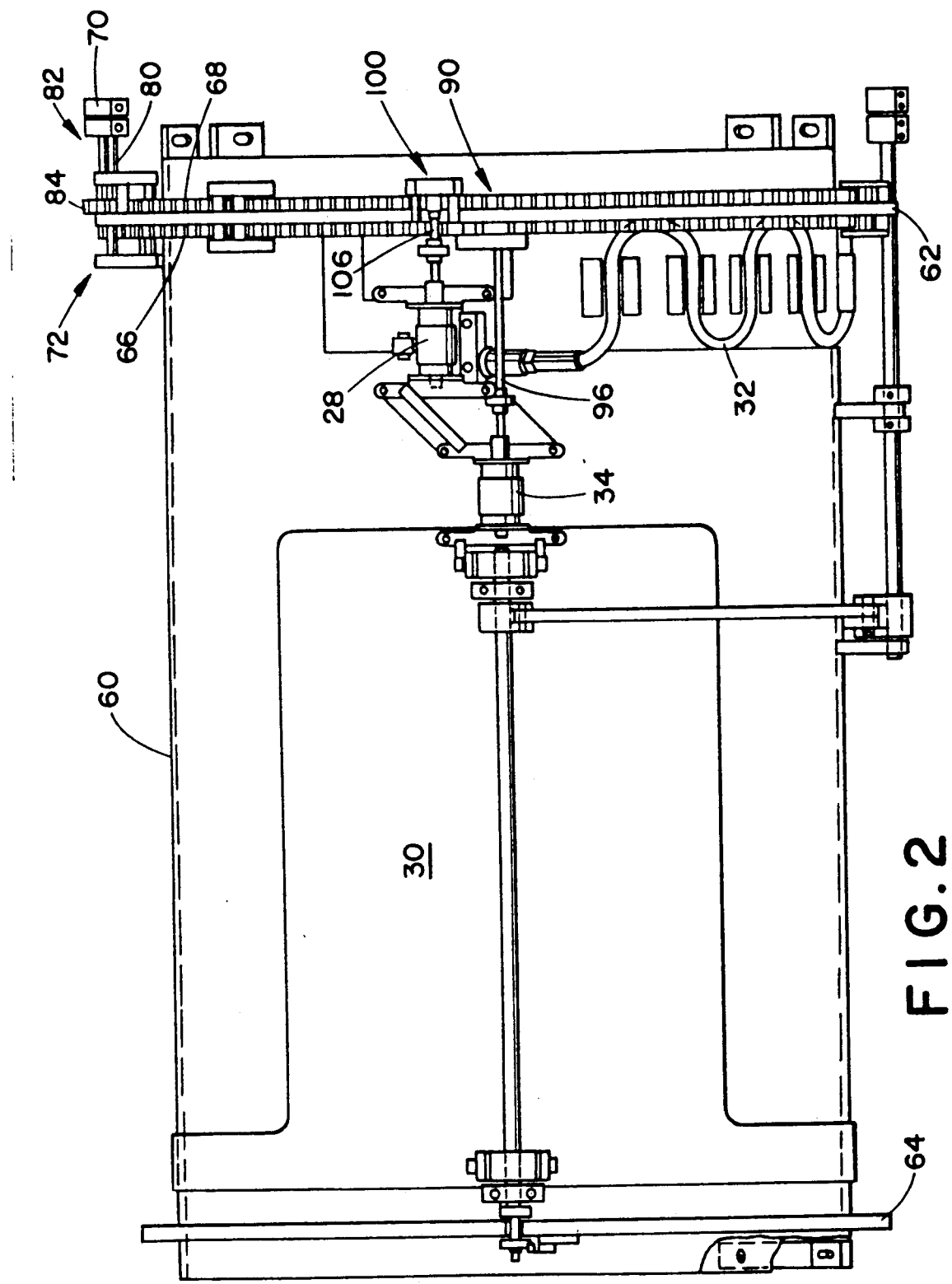
FIG. 2 is an enlarged, side view of the resonator coil of the scanner of FIG. 1.
Figure 3:
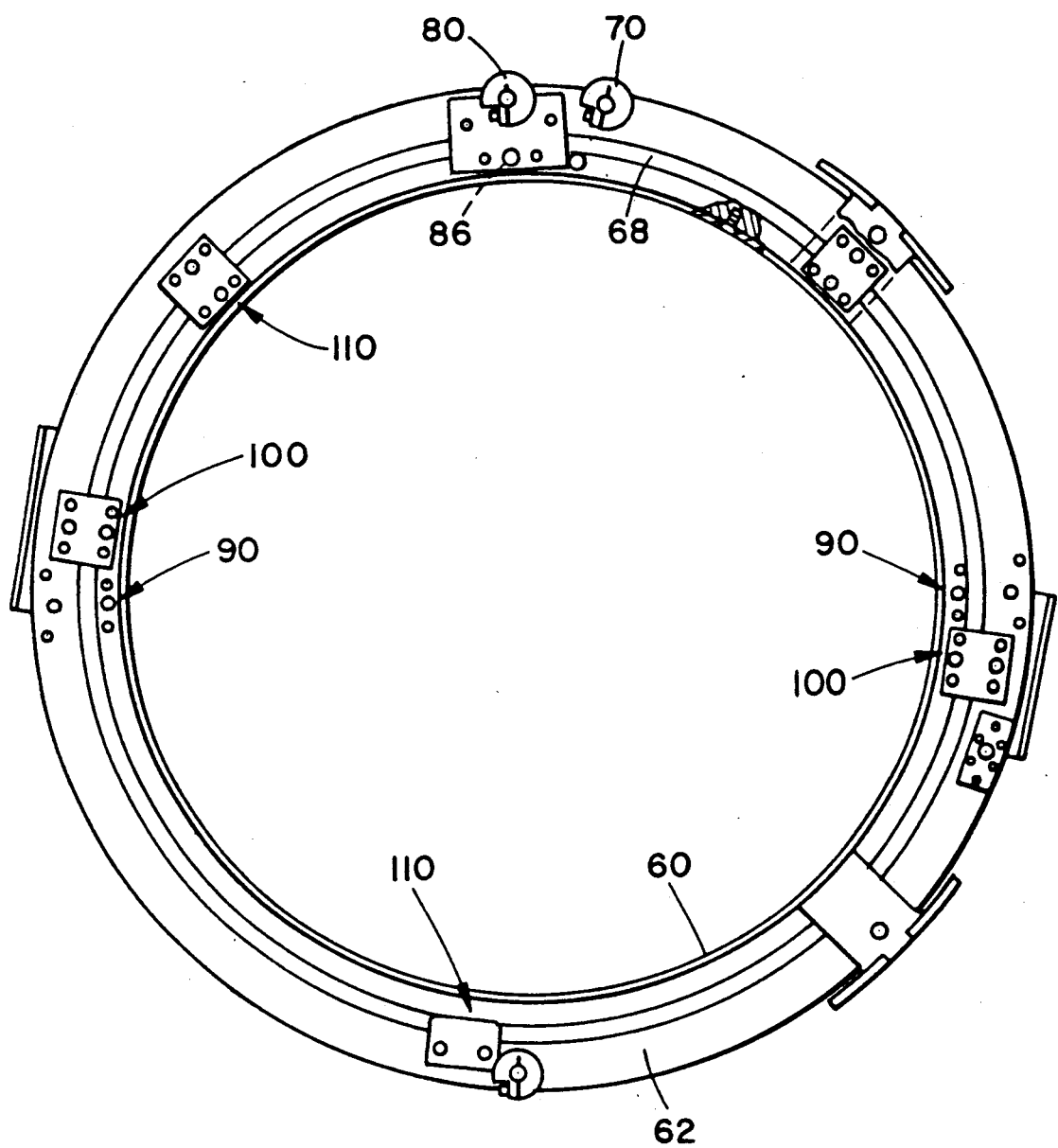
FIG. 3 is an end view of the whole body resonator coil of FIG. 2.

With particular reference to FIGS. 2 and 3, the resonator coil includes a dielectric sleeve 60 having annular dielectric reinforcing ribs or rings 62, 64 adjacent opposite ends thereof. The annular reinforcing ribs assist in maintaining the dielectric cylinder circular in cross section. A first ring gear 66 is disposed circumferentially around the cylinder to one side of annular reinforcing rib 64. A second ring gear 68 is disposed circularly around the dielectric cylinder to the opposite side of the annular reinforcing rib 64.

Figure 4:
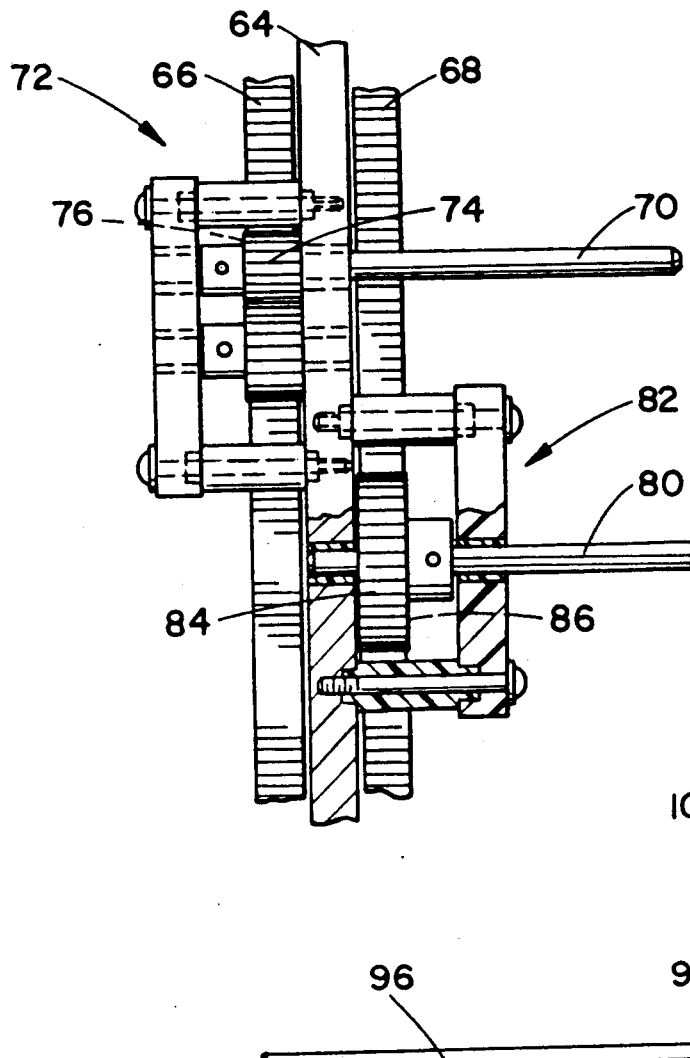
FIG. 4 is a detailed side view at Section 4—4 of the resonator of FIGS. 2 and 3.

With continuing reference to FIGS. 2 and 3 and further reference to FIG. 4, a first drive shaft 70 interconnects the motor 36 with a first toothed drive gear assembly 72. A toothed drive gear 74 engages like teeth which are precision machined in the dielectric ring gear 66. A roller 76 is disposed on the opposite side of the ring gear 66 from the toothed drive gear 74 to hold to the teeth of the ring gear in contact with the toothed drive gear 74. In this manner, rotation of shaft 70 causes the first ring gear 66 to rotate around the dielectric cylinder 60.

Analogously, a second drive shaft so extends from the motor 38 to a second toothed drive gear assembly 82. A second toothed drive gear 84 engages the teeth of the second ring gear 68. A roller 86 engages the opposite side of the ring gear to hold the teeth in meshing engagement.

Figure 5:
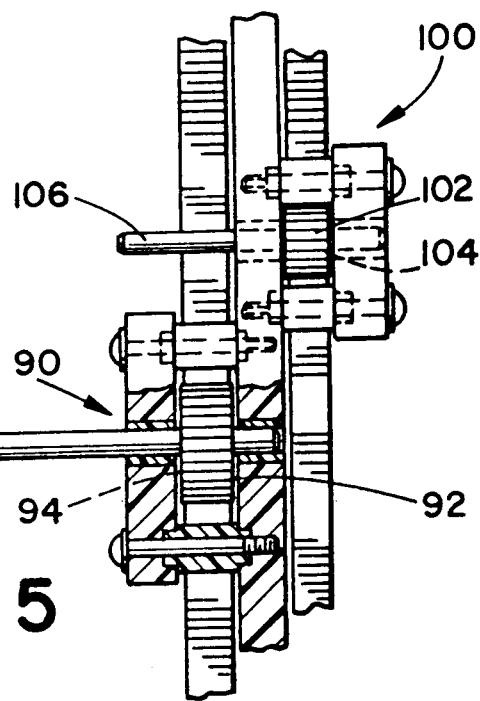
FIG. 5 is a detailed enlarged side view of the capacitor and drive gear arrangements through views 5—5 of the resonator coil of FIGS. 2 and 3; and, FIG. 6 is a detailed sectional view of keeper assemblies for preventing deformation of the ring gear.
Figure 6:
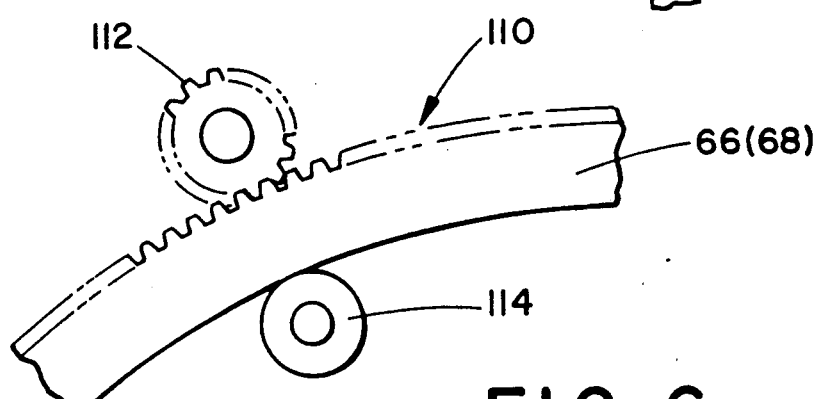

With particular reference to FIG. 5, each of the tuning capacitors is associated with a driven gear assembly. A first driven gear assembly 90 includes a toothed driven gear 92 whose teeth are held in contact with the teeth of the ring gear 66 by a roller 94. A driven shaft 96 connects the toothed driven gear 92 with the associated matching capacitor 34.

A second pair of toothed driven gear assemblies 100 are mounted 180° opposite each other to be driven by the second o toothed ring gear 68. Each of the second driven gear assemblies 100 includes a toothed driven gear 102 whose teeth are held in meshing engagement with the teeth of the ring gear 68 by a roller 104. A driven shaft 106 interconnects the driven gear with the respective matching capacitor 34.

The ring gears 66 and 68 are each supported at three points, at the input drive assemblies 72, 82 and at the two respective output or driven gear assemblies 90, 100. Moreover, the annular reinforcing rib or ring 64 and the two ring gears 66 and 68 are each contructed of an appropriate dielectric material, such as DELRIN, a plastic material which has a low friction surface. In this manner, the sliding engagement between the ring gears and the support ring is self lubricated and requires no added lubrication.

Although no additional support beyond these three points is required, a plurality of keepers 110 are provided for maintaining the annular ring in a circular configuration. Note if one of the driven gears should jam and refuse to rotate, input force from the driving gears could cause the associated ring gear to deform, buckling outward or inward. To prevent such unwanted buckling, a keeper assembly is mounted between the driving gear and each driven gear and at a point generally midway between the two driven gears diametrically opposite to the driving gears.

Each of the keeper arrangements includes a gear and roller pair 112, 114 which sandwich the ring gear therebetween. This is essentially the same construction as the driving and driven gear assemblies except that the toothed gear is not connected with an input or output shaft. Optionally, the gear may be a roller which engages the teeth of the corresponding ring gear. Optionally, additional keepers may be provided, as may be appropriate, to minimize load dependent deflections of the ring gears.

By precisely drilling the mounting holes for the drive and driven gear assemblies in the annular reinforcing ring 64, the ring gears 66, 68 can be mounted with little or no calibration. Once the ring gears are fixed between each gear and idler roller, the calibration is set. The relative diameter of the drive and driven gears is selected to effect a desired gear ratio between the drive motors 36, 38 and the tuning and matching capacitances 28, 34.

The invention has been described with reference to the preferred embodiment. Obviously modifications and alterations will occur to those of ordinary skill in the art upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A magnetic resonance imaging apparatus comprising:
    a magnetic field means for creating primary and gradient magnetic fields through an examination region;
    a resonator coil assembly for inducing dipoles of a subject in an examination region to resonate, the resonator coil means including:
        a dielectric cylinder which surrounds the examination region;
        at least one pair of coil segments mounted oppositely about the dielectric cylinder;
        a plurality of tuning and matching reactances mounted oppositely about the cylinder;
        at least one annular, dielectric reinforcing ring extending circumferentially about the cylinder adjacent one end;
        a first drive gear mounted adjacent the reinforcing ring;
        a first pair of driven gears mounted to the reinforcing ring oppositely about the cylinder, the first pair of driven gears each being connected with one of a first pair the reactances such that rotation of the first driven gear causes a corresponding adjustment of the reactances;
        a first ring gear mounted on the first driving gear and first pair of driven gears such that rotation of the drive gear causes rotation of the ring gear about the cylinder causing corresponding rotation of the first pair of driven gears;
    an radio frequency transmitter operatively connected with the resonator coil means for transmitting radio frequency pulses into the examination region;
    a receiver means for receiving magnetic resonance signals from the examination region; and,
    an image reconstruction means for reconstructing an image representation from the received magnetic resonance signals.

2. The imaging apparatus as set forth in claim 1 wherein the resonator coil assembly further includes:
    a second drive gear mounted adjacent the reinforcing ring;
    a second pair of driven gears mounted to the reinforcing ring oppositely about the cylinder, the second pair of driven gears each being connected with one of a second pair of the reactances such that rotation of the second driven gear causes a corresponding adjustment of the second pair of reactances;
    a second ring gear mounted on the second driving gear and second pair of driven gears such that rotation of the drive gear causes rotation of the ring gear about the cylinder causing corresponding rotation of the second pair of driven gears and a corresponding concurrent adjustment of the second pair of reactances.

3. The imaging apparatus as set forth in claim 1 wherein the coil segments are constructed of foil and adhered directly to the dielectric cylinder.

4. The imaging apparatus as set forth in claim 2 wherein the tuning and matching reactances are adjustable capacitors.

5. The imaging apparatus as set forth in claim 4 wherein the tuning and matching capacitors are disposed contiguous to each other.

6. The imaging apparatus as set forth in claim 2 further including keepers mounted to the supporting ring for preventing the first and second ring gears from deforming.

7. The imaging apparatus as set forth in claim 2 further including a roller mounted opposite each drive and driven gear for holding the ring gear and the drive and driven gears in firm engagement.

8. A magnetic resonance apparatus comprising:

a magnetic field means for creating a magnetic field through an examination region;

a resonator coil means including:

a dielectric cylinder means for supporting a pair of antenna segments circumferentially around the examination region;

a pair of adjustable reactances mounted oppositely about the cylinder means, each reactances being electrically connected with one of the pair of antenna segments, the reactances each being connected with one of a pair of driven gears to be adjusted by rotation of the driven gears;

a circular ring gear extending circumferentially around the cylinder means, the ring gear having an array of teeth disposed along the ring gear peripherally around the dielectric cylinder, the array of teeth intermeshing with arrays of teeth disposed peripherally around the driven gears and a drive gear such that rotation of the driven gear pushes the ring gear to rotate circumferentially around the cylinder causing like rotation of the driven gears;

a radio frequency means for transmitting radio frequency pulses into the examination region and receiving resonance signals emanating from the examination region, the radio frequency means being operatively connected with the antenna segments.

9. A magnetic resonance apparatus comprising:

a magnetic field means for creating a magnetic field through an examination region;

a resonator coil means including:

a dielectric cylinder means for supporting a pair of antenna segments circumferentially around the examination region;

a first pair of adjustable reactances mounted oppositely about the cylinder means, each reactance being electrically connected with one of the pair of antenna segments, the reactances each being connected with one of a first pair of driven gears to be adjusted by rotation of the first driven gears;

a first ring gear extending circumferentially around the cylinder means engaging the first pair of driven gears and a first drive gear such that the first drive gear causes the first ring gear to rotate circumferentially around the cylinder causing like rotation of the first driven gears;

a second pair of adjustable reactances, each connected electrically with one of the first adjustable reactances and mechanically with one of a second pair of driven gears to be adjusted by rotation thereof;

a second ring gear extending circumferentially about the cylinder means in engagement with the second pair of driven gears and a second drive gear such that rotation of the second drive gear causes the second ring gear to rotate circumferentially around the dielectric cylinder concurrently rotating the second pair of driven gears and adjusting the second pair of reactances;

a radio frequency means for transmitting radio frequency pulses into the examination region and receiving resonance signals emanating from the examination region, the radio frequency means being operatively connected with the antenna segments.

10. The apparatus as set forth in claim 8 wherein the ring gear is a unitary plastic construction and further including a plurality of keepers for preventing the ring gear from deforming.

11. A magnetic resonance apparatus comprising:

a magnetic field means for creating a magnetic field through an examination region;

a resonator coil means including:

a dielectric cylinder means for supporting a plurality of antenna segments circumferentially around the examination region;

a plurality of adjustable reactances mounted oppositely about the cylinder means, the reactance being electrically connected with the antenna segments, the reactances being connected with driven gears to be adjusted by rotation of the driven gears;

a circular ring gear extending circumferentially around the cylinder means engaging the driven gears and a drive gear such that rotation of the drive gear causes the circular ring gear to rotate circumferentially around the cylinder causing like rotation of the driven gears;

a plurality of rollers, each roller being disposed adjacent one of the drive and driven gears for urging the ring gear into firm contact therewith;

a radio frequency means for transmitting radio frequency pulses into the examination region and receiving resonance signals emanating from the examination region, the radio frequency means being operatively connected with the antenna segments.

12. The apparatus as set forth in claim 8 wherein the adjustable first pair of reactances includes adjustable capacitors.

13. A resonator coil assembly for a magnetic resonance apparatus, the coil assembly comprising:

a dielectric cylinder for surrounding an examination region;

at least two antenna segments mounted symmetrically about the cylinder;

at least two adjustable reactances, each mounted to one of the antenna segments and disposed oppositely about the cylinder, each adjustable reactance being connected with one of a plurality of driven gears to be selectively adjusted by rotation thereof;

a ring gear having a circular cross section extending circumferentially around the cylinder, the ring gear having teeth along one peripheral surface for engaging peripheral teeth of the driven gears and a drive gear such that rotation of the drive gear pushes the ring gear to rotate around the cylinder to carry force for rotating the driven gears.

14. A resonator coil assembly for a magnetic resonance apparatus, the coil assembly comprising:

a dielectric cylinder surrounding an examination region;

a dielectric reinforcing ring mounted to the cylinder and extending circumferentially therearound to assist the cylinder in maintaining a circular cross section;

at least one pair of antenna segments mounted symmetrically about the cylinder;

a pair of adjustable reactances, each mounted to one of the antenna and disposed oppositely about the cylinder, each adjustable reactance being connected with one of a pair of driven gears to be selectively adjusted by rotation thereof;

a ring gear extending circumferentially around the cylinder engaging the pair of driven gears and a drive gear such that rotation of the drive gear causes the ring gear to rotate around the cylinder causing corresponding rotation of the pair of driven gears.

15. The coil assembly as set forth in claim 14 wherein the drive and driven gears are each a part of a gear assembly including a toothed gear for meshing with teeth of the ring gear and a roller for firmly urging the teeth of the ring gear into meshing engagement with the toothed gear, the gear assemblies being mounted to the reinforcing ring with the ring gear in close proximity thereto.

16. The coil assembly as set forth in claim 15 further including a plurality of keepers mounted to the reinforcing ring, each keeper including a toothed gear and a roller for engaging the ring gear to prevent distortion.

17. A resonator coil assembly for a magnetic resonance apparatus, the coil assembly comprising:
a dielectric cylinder for surrounding an examination region;
at least one pair of antenna segments mounted symmetrically about the cylinder;
first adjustable reactances, each first adjustable reactance mounted to one of the antenna segments and disposed oppositely about the cylinder, each adjustable reactance being connected with one of first driven gears to be selectively adjusted by rotation thereof;
second adjustable reactance s connected with the antenna segments and mounted oppositely about the cylinder, the second adjustable reactances each being connected with one of second driven gears;
first and second ring gears extending circumferentially around the cylinder for engaging the first and second driven gears and first and second driving gears such that rotation of the first and second drive gears causes the first and second ring gears to rotate circumferentially about the cylinder causing the first and second driven gears to rotate therewith.

18. The coil assembly as set forth in claim 17 further including a reinforcing ring mounted to the cylinder adjacent one end thereof and extending radially outward therefrom, the first and second ring gears being disposed on opposite sides of the reinforcing ring and each being supported at three points thereon, the respective driven gear and pair of driven gears.

* * * * *